United States Patent
Xia et al.

(10) Patent No.: US 7,871,926 B2
(45) Date of Patent: Jan. 18, 2011

(54) METHODS AND SYSTEMS FOR FORMING AT LEAST ONE DIELECTRIC LAYER

(75) Inventors: Li-Qun Xia, Santa Clara, CA (US);
Mihaela Balseanu, Sunnyvale, CA (US); Victor Nguyen, Novato, CA (US);
Derek R. Witty, Fremont, CA (US);
Hichem M'Saad, Santa Clara, CA (US);
Haichun Yang, Santa Clara, CA (US);
Xinliang Lu, Fremont, CA (US);
Chien-Teh Kao, Sunnyvale, CA (US);
Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 497 days.

(21) Appl. No.: 11/876,649

(22) Filed: Oct. 22, 2007

(65) Prior Publication Data
US 2009/0104764 A1 Apr. 23, 2009

(51) Int. Cl.
*H01L 21/4763* (2006.01)
*H01L 21/31* (2006.01)
(52) U.S. Cl. .............. 438/624; 438/758; 438/761; 438/763; 257/E21.249; 257/E21.293
(58) Field of Classification Search ........... 438/761, 438/763, 624, 758; 257/E21.249, E21.293
See application file for complete search history.

(56) References Cited

U.S. PATENT DOCUMENTS

| | | | |
|---|---|---|---|
| 5,558,717 A | 9/1996 | Zhao et al. | |
| 6,149,828 A | 11/2000 | Vaartstra | |
| 6,191,026 B1* | 2/2001 | Rana et al. | 438/624 |
| 6,379,575 B1 | 4/2002 | Yin et al. | |
| 6,387,207 B1 | 5/2002 | Janakiraman et al. | |
| 6,830,624 B2 | 12/2004 | Janakiraman et al. | |
| 6,867,141 B2* | 3/2005 | Jung et al. | 438/695 |
| 7,288,482 B2 | 10/2007 | Panda et al. | |
| 2004/0129224 A1* | 7/2004 | Yamazaki | 118/724 |
| 2007/0107750 A1 | 5/2007 | Sawin et al. | |
| 2007/0232071 A1* | 10/2007 | Balseanu et al. | 438/694 |
| 2007/0269976 A1* | 11/2007 | Futase et al. | 438/637 |
| 2008/0124937 A1 | 5/2008 | Xu et al. | |
| 2009/0104782 A1 | 4/2009 | Lu et al. | |

OTHER PUBLICATIONS

U.S. Appl. No. 60/803,499, filed May 30, 2006 to Lubomirsky et al.
PCT International Search Report mailed Apr. 26, 2010; International Application No. PCT/US2009/059743, 4 pages.

* cited by examiner

*Primary Examiner*—Michael Trinh
(74) *Attorney, Agent, or Firm*—Townsend and Townsend and Crew

(57) ABSTRACT

A method for forming a structure includes forming at least one feature across a surface of a substrate. A nitrogen-containing dielectric layer is formed over the at least one feature. A first portion of the nitrogen-containing layer on at least one sidewall of the at least one feature is removed at a first rate and a second portion of the nitrogen-containing layer over the substrate adjacent to a bottom region of the at least one feature is removed at a second rate. The first rate is greater than the second rate. A dielectric layer is formed over the nitrogen-containing dielectric layer.

17 Claims, 10 Drawing Sheets

METHODS AND SYSTEMS FOR FORMING AT LEAST ONE DIELECTRIC LAYER

CROSS-REFERENCES TO RELATED APPLICATIONS

This application is related to co-assigned U.S. Provisional Patent Application No. 60/803,499 to Lubomirsky et al, filed May 30, 2006, and titled "PROCESS CHAMBER FOR DIELECTRIC GAPFILL." This application is related to co-assigned U.S. Pat. No. 6,387,207 to Janakiraman et al., issued May 14, 2002, and titled "INTEGRATION OF REMOTE PLASMA GENERATOR WITH SEMICONDUCTOR PROCESSING CHAMBER." This application is related to and co-assigned U.S. Pat. No. 6,830,624 to Janakiraman et al., issued Dec. 14, 2004, and titled "BLOCKER PLATE BY-PASS FOR REMOTE PLASMA CLEAN." This application is also related to co-assigned U.S. Pat. No. 5,558,717 to Zhao et al., and titled "CVD PROCESSING CHAMBER." The entire contents of both related applications is hereby incorporated by reference for all purposes.

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The smaller sizes, however, mean device elements have to work closer together which can increase the chances of electrical interference, including cross-talk and parasitic capacitance.

To reduce the degree of electrical interference, dielectric insulating materials are used to fill the gaps, trenches, and other spaces between the device elements, metal lines, and other device features. The dielectric materials are chosen for their ease of formation in the spaces between device features, and their low dielectric constants (i.e., "k-values"). Dielectrics with lower k-values are better at minimizing cross-talk and RC time delays, as well as reducing the overall power consumption of the device. Conventional dielectric materials include silicon oxide, which has an average k-value between 4.0 and 4.2 when deposited with conventional CVD techniques.

During the formation of semiconductor devices, silicon nitride dielectric films have been used as barriers or etch stop layers in various applications. Silicon nitride dielectric films have etch rates different from those of silicon oxide such as low-k dielectric materials. Silicon nitride dielectric films may provide a desired protection for structure such as transistor gates lying thereunder.

However, the thickness non-uniformity of a silicon nitride dielectric film formed across a wafer having dense and isolated devices may be undesired. Further, the thickness of a silicon nitride dielectric film formed on a bottom, sidewall and top of a step-height profile may also adversely affect the gap-filling effect of a subsequent low-k dielectric material. The situation becomes even worse when semiconductor device geometries are scaling down.

BRIEF SUMMARY OF THE INVENTION

Accordingly to an exemplary embodiment, a method for forming a structure includes forming at least one feature across a surface of a substrate. A nitrogen-containing dielectric layer is formed over the at least one feature. A first portion of the nitrogen-containing layer on at least one sidewall of the at least one feature is removed at a first rate and a second portion of the nitrogen-containing layer over the substrate adjacent to a bottom region of the at least one feature is removed at a second rate. The first rate is greater than the second rate. A dielectric layer is formed over the nitrogen-containing dielectric layer.

Accordingly to another exemplary embodiment, a method for forming a transistor includes forming at least one transistor gate over a substrate. At least one dielectric spacer is formed on sidewalls of the at least one transistor gate. At least one contact region is formed within the substrate and adjacent to the transistor gate. A nitrogen-containing dielectric layer is formed over the at least one transistor gate. A first portion of the nitrogen-containing layer on at least one sidewall of the at least one transistor gate is removed at a first rate and a second portion of the nitrogen-containing layer over the substrate adjacent to a bottom region of the at least one transistor gate is removed at a second rate, wherein the first rate is greater than the second rate. A dielectric layer is formed over the nitrogen-containing dielectric layer.

According to an alternative embodiment, a method for forming a structure includes forming at least one feature across a surface of a substrate. A first dielectric layer is formed over the at least one feature. A second dielectric layer is formed over the first dielectric layer. A first portion of the second dielectric layer on at least one sidewall of the at least one feature is removed at a first rate and a second portion of the second dielectric layer over the substrate adjacent to a bottom region of the at least one feature is removed at a second rate. The first rate is greater than the second rate. A third dielectric layer is formed over the etched second dielectric layer.

According to the other exemplary embodiment, an apparatus includes a chamber. A pedestal is configured within the chamber for supporting a substrate having a nitrogen-containing layer formed over at least one feature formed across the substrate. A showerhead is configured within the chamber and over the pedestal. A plasma generator is coupled to the chamber, wherein the plasma generator is configured to generate a plasma including fluorine ions and hydrogen ions. The plasma being is provided within the chamber to remove a first portion of the nitrogen-containing layer on at least one sidewall of the at least one feature at a first rate and a second portion of the nitrogen-containing layer over the substrate adjacent to a bottom region of the at least one feature at a second rate, the first rate being greater than the second rate.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for forming at least one dielectric layer over at least one feature, e.g., transistor gate, formed across a surface of a substrate. The dielectric layer is subjected to an etch process. The etch process may desirably reduce aspect ratio gaps and/or trenches (e.g., aspect ratios of about 5:1 or more). A dielectric layer then may be formed over the etched dielectric layer, such that the aspect ratio gaps and/or trenches may be filled with dielectric materials substantially without gaps or seams.

The methods of the invention include forming at least one feature across a surface of a substrate. A dielectric layer is formed over the at least one feature. A first portion of the dielectric layer around the corner of the feature is removed at a first rate and a second portion of the dielectric layer over the substrate adjacent to a bottom region of the at least one feature is removed at a second rate. The first rate is greater than the second rate. A dielectric layer is formed over the etched dielectric layer.

Exemplary Processes

FIGS. 1A-1D are schematic cross-sectional views showing an exemplary process for filling exemplary dielectric materials between two transistor gates.

Figure 1A:
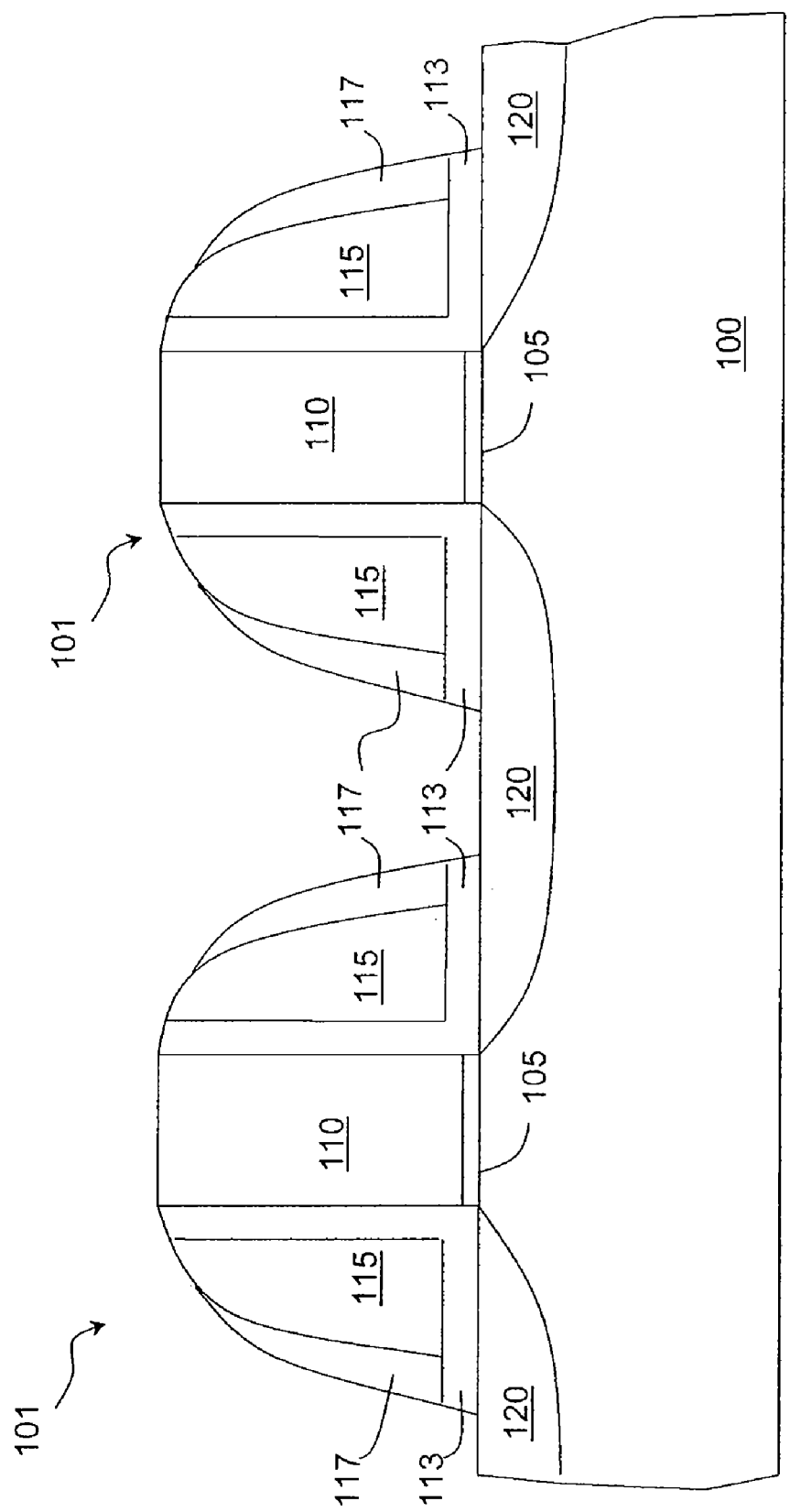
FIGS. 1A-1D are schematic cross-sectional views showing an exemplary process for filling exemplary dielectric materials between two transistor gates.

Referring to FIG. 1A, at least one feature 101 is formed across a surface of a substrate 100. The features 101 may be, for example, transistors, transistor gates, trenches, openings, gaps, conductive lines or other feature that has an aspect ratio. The transistors 101 may be formed over the substrate 100. The substrate 100 may be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, the substrate 100 may be a semiconductor wafer (e.g., a 200 mm, 300 mm, 400 mm, etc. silicon wafer).

Each of the transistors 101 may include a gate dielectric layer 105 formed over the substrate 100. A transistor gate 110 formed over the gate dielectric layer 105. Contact regions 120, e.g., source/drain regions, are formed within the substrate 100 and adjacent to the transistor gate 110. The gate dielectric layer 105 may be made of, for example, silicon oxide, silicon nitride, silicon oxynitride, high-k dielectric material, e.g., aluminum oxide ($Al_2O_3$), hafnium oxide ($HfO_2$), hafnium oxynitride (MfON), hafnium silicate (Hf-$SiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide ($CeO_2$), titanium oxide ($TiO_2$), tantalum oxide ($Ta_2O_5$), other dielectric material or various combinations thereof. The gate dielectric layer 105 may be formed by, for example, a chemical vapor deposition (CVD) process, a physical vapor deposition (PVD) process, other semiconductor process that is adapted to form a gate dielectric material layer or various combinations thereof.

The transistor gate 110 may be made of, for example, polysilicon; amorphous silicon; metallic material, e.g., Ru, Ti, Ta, W, Hf, Cu, Al; metal nitride; metal oxide such as $RuO_2$ or $IrO_2$; metal nitride such as MoN, WN, TiN, TaN, TaAlN; gate silicide such as $CoSi_2$ or NiSi; other metallic material that is adapted to be used for transistor gates, or various combinations thereof. In some embodiments, the transistor gate 110 may be formed by a CVD process, a PVD process, an electrochemical plating process, an electroless plating process or various combinations thereof.

The contact regions 120 are formed within the substrate 100. The contact regions 120 may have n-type dopants such as phosphorus and arsenic or p-type dopants such as boron. The contact regions 120 may be formed by at least one implantation process. In some embodiments, the contact regions 120 may include at least one lightly doped drain (LDD).

Referring again to FIG. 1A, at least one dielectric layer such as oxide layers 113, nitride layers 115 and oxide layers 117 are formed on sidewalls of the transistor gate 110. The oxide layers 113, the nitride layers 115 and the oxide layers 117 may be configured to protect the transistor gate 110 and/or to serve as a mask for implanting ions into the substrate 100 to form the contact regions 120. In some embodiments, the oxide layers 113, the nitride layers 115 and the oxide layers 117 may be formed by, for example, CVD process. It is noted that the multi-layer spacer is merely an exemplary embodiment. A single dielectric layer spacer may be used in other embodiments.

In some embodiments, the transistor gate 110 may have a width of about 35 nanometer (nm) and a height of about 100 nm. The space between the transistor gates 110 may be about 180 nm. The bottom width of the oxide layer 113, the nitride layer 115 and the oxide layer 117 may be about 35 nm. It is noted that other dimensions of the transistors 101 may be used to achieve desired transistors. The scope of the present application is not limited thereto.

Figure 1B:
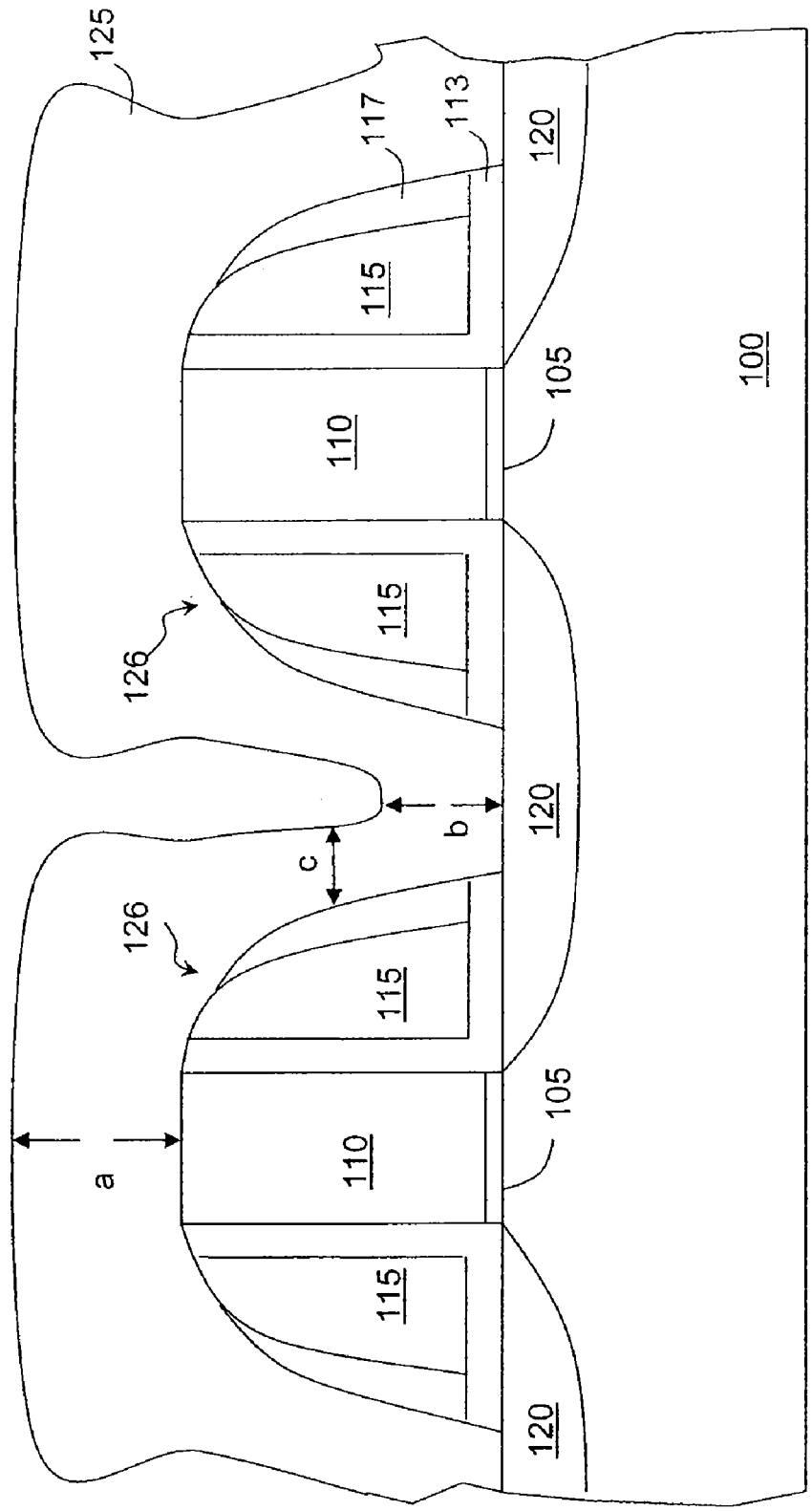

In FIG. 1B, at least one dielectric layer such as a dielectric layer 125 may be formed over the transistors 101. The dielectric layer 125 may be, for example, a silicon nitride (SiN) layer, a silicon oxynitride (SiON) layer, a silicon carbon nitride (SiCN) layer, a silicon oxide layer, a silicon oxycarbide layer, a silicon carbide layer, a silicon boron nitride layer, a boron nitride layer, other dielectric layer or various combinations thereof.

In some embodiments forming a nitrogen-containing dielectric layer, the dielectric layer 125 may be formed from a silicon-containing precursor such as silane ($SiH_4$), dichlorosilane ($SiH_2Cl_2$), tricholorosilane ($SiHCl_3$), and silicontetrachloride ($SiCl_4$) and a nitrogen-containing precursor such as nitrogen ($N_2$) and ammonia ($NH_3$). In other embodiments, the dielectric layer 125 may be formed from a silicon-containing precursor such as alkoxy disilanes, alkoxy-alkyl disilanes, alkoxy-acetoxy disilanes and polysilanes; and a nitrogen-containing precursor such as nitrogen and ammonia. For example, the alkoxy disilanes may include $Si_2(EtO)_6$ ethoxy disilanes, $Si_2(MeO)_6$ methoxy disilanes, and $Si_6(MeO)_{12}$ methoxy cyclohexylsilanes, where Et denotes ethyl group ($C_2H_6$) and Me denotes methyl group ($CH_3$). In some embodiments, the alkoxy-alkyl disilanes may include Si$_2$(EtO)$_4$(Me)$_2$ tetraethoxy-dimethyl disilanes, Si$_2$(EtO)$_4$(Et)$_2$ tetraethoxy-diethyl disilanes, Si$_2$(EtO)$_2$(Me)$_4$ diethoxy-tetramethyl disilanes, Si$_2$(MeO)$_4$(Me)$_2$ tetramethoxy-dimethyl disilanes, and Si$_4$O$_2$(Me)$_8$ methyl cyclohexylsiloxanes, Si$_6$(MeO)$_6$(Me)$_6$ methoxy-methyl cyclohexylsilanes, Si$_4$O$_2$(H$_2$)$_4$ hydro-cyclohexylsiloxanes. In some embodiments, the alkoxy-acetoxy disilanes may include Si$_2$(AcO)$_6$ acetoxy disilanes, Si$_2$(Me)$_4$(AcO)$_2$ tetramethyl-diacetoxy disilanes, and Si$_2$(Me)$_2$(AcO)$_4$ dimethyl-tetracetoxy disilanes, where Ac denotes acetyl group. In some embodiments, the polysilanes may include cyclopentylsilanes or other subinstitutes.

Referring again to FIG. 1B, it is found that the dielectric layer 125 may have pinch-off and/or negative profiles around the corners 126 of the transistors 101. The pinch-off and/or negative profiles of the dielectric layer 125 may result in a void or seam between the transistors 101 if a thick dielectric layer 125 is formed. In some embodiments, the thickness "a" of the dielectric layer 125 on the transistor gate 110 is greater than the thickness "b" of the dielectric layer 125 on the substrate 100 and adjacent to the bottom region of the transistor 101. In still other embodiments, the thickness "b" of the dielectric layer 125 is greater than the thickness "c" of the dielectric layer 125 on the sidewalls of the transistor 101.

Figure 1C:
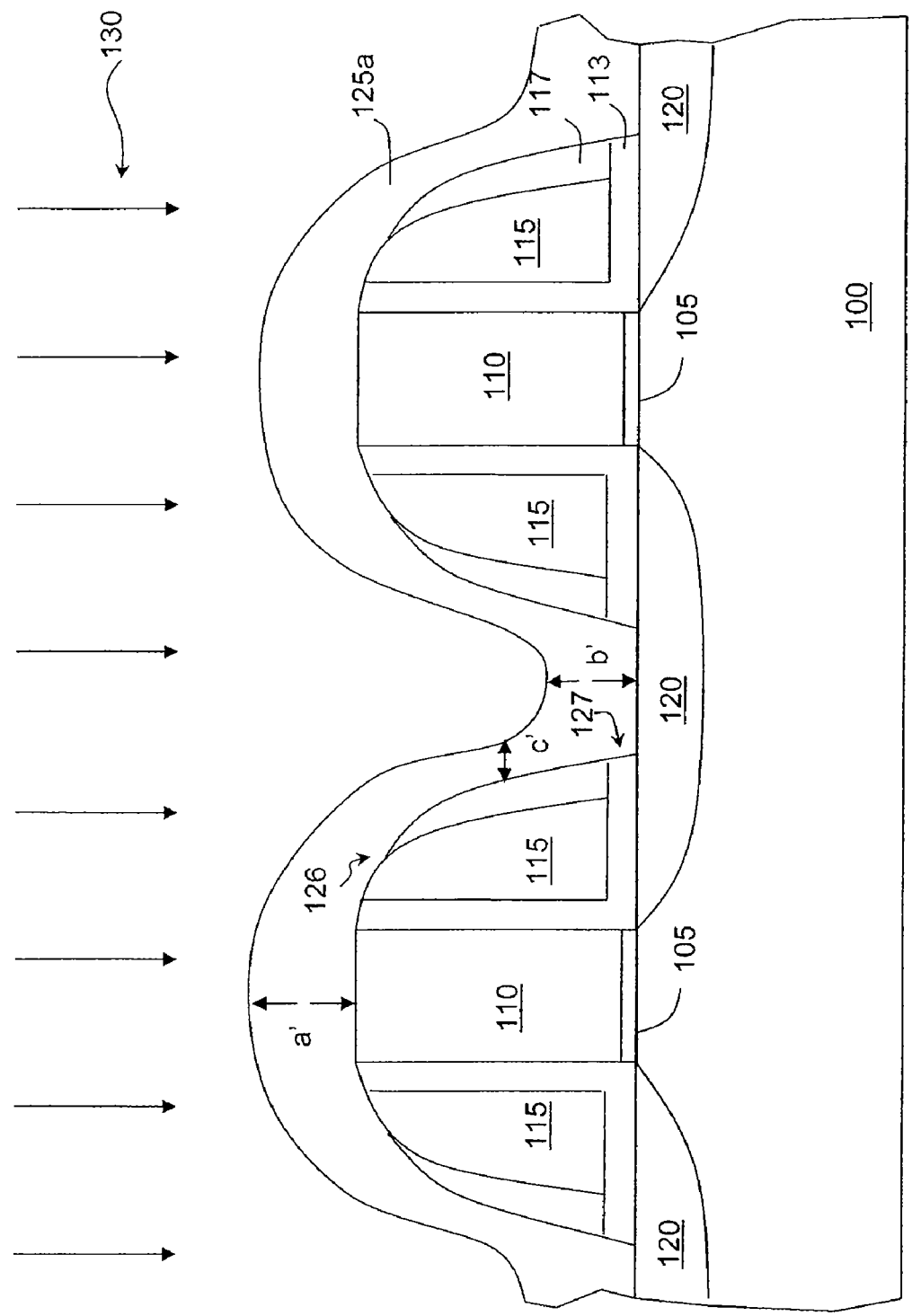

Referring to FIG. 1C, an etch process 130 may remove a first portion of the dielectric layer 125 around the corner 126 of the transistor 101 at a first etch rate and a second portion of the dielectric layer 125 adjacent to the bottom region 127 of the transistor 101 at a second etch rate, wherein the first etch rate is greater than the second etch rate.

In some embodiments removing portions of the dielectric layer 125, e.g., a silicon nitride (SiN) layer, the etch process 130 may use a fluorine-containing precursor such as nitrogen trifluoride (NF$_3$), silicon tetrafluorid (SiF$_4$), tetrafluoromethane (CF$_4$), fluoromethane (CH$_3$F), difluoromethane (CH$_2$F$_2$), trifluoromethane (CHF$_3$), octafluoropropane (C$_3$F$_8$), hexafluoroethane (C$_2$F$_6$), other fluorine-containing precursor or various combinations thereof; and a hydrogen-containing precursor such as hydrogen (H$_2$), ammonia (NH$_3$), hydrazine (N$_2$H$_4$), hydrazoic acid (HN$_3$), other hydrogen-containing precursor and various combinations thereof. In some embodiments, the etch process 130 may have a gas flow rate between about 10 standard cubic centimeter per minute (sccm) and about 5 standard liter per minute (slm); a process pressure between about 100 millitorrs and about 200 torrs; a radio frequency (RF) power between about 5 watts and about 3,000 watts and a RF between about 100 kHz and about 64 MHz. In other embodiments, the RF may be between about 400 kHz and about 13.67 MHz.

Figure 2A:
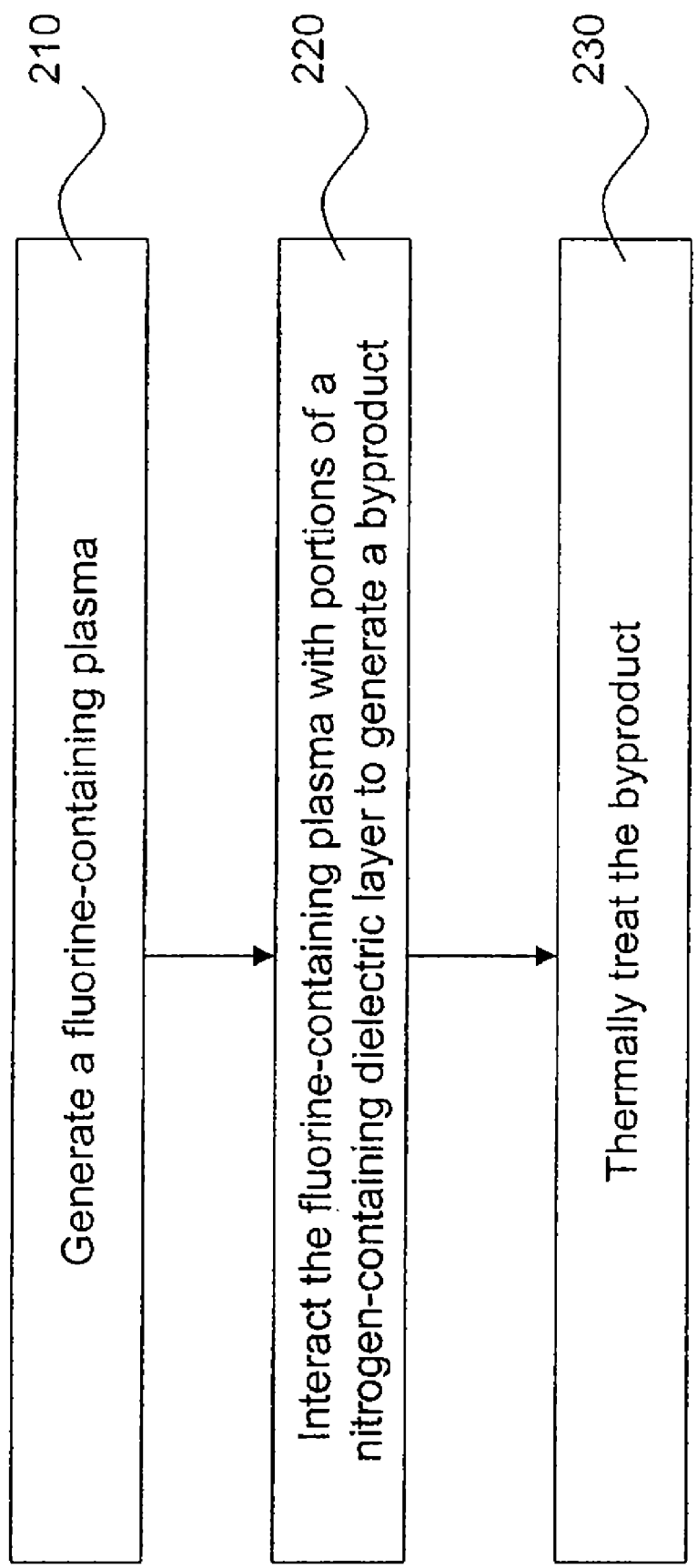
FIG. 2A is a flow chart showing an exemplary process for removing portions of a nitrogen-containing dielectric layer.

In some embodiments, NF$_3$, H$_2$ and He are provided into an external plasma generator for generating a plasma as described in step 210 of FIG. 2A. NF$_3$ may have a flow rate of about 50 sccm; H$_2$ may have a flow rate of about 300 sccm; and He may have a flow rate of about 100 sccm. The process pressure is about 3 torrs and the RF power is about 40 watts. In some embodiments, the plasma may be generated within the etch chamber configured to carry out the etch process 130. The plasma may be generated as the formula described below:

NF$_3$+H$_2$→NH$_x$F$_y$(or NH$_x$F$_y$.HF)+HF+F

The plasma then may be introduced into an etch chamber for etching portions of the silicon nitride layer. The remote-generated plasmas may interact with silicon nitride to form a byproduct, e.g., (NF$_4$)$_2$SiF$_6$ as described in step 220 of FIG. 2A. In some embodiments, the substrate 100 is disposed over a pedestal having a temperature between about −100° C. and about 1,000° C. In other embodiments, the pedestal may have a temperature of about 30° C. The temperature of the pedestal may desirably enhance the interaction of the plasma and silicon nitride. In some embodiments, the interaction of the plasma and silicon nitride may be referred to as an etch step. The etch step may be described as the following formula:

NH$_x$F$_y$.HF+SiN→(NF$_4$)$_2$SiF$_6$+N$_2$+NH$_3$

The byproduct, (NF$_4$)$_2$SiF$_6$, may then subjected to a thermal process to decompose and/or sublimate the byproduct as described in step 230 of FIG. 2A. In some embodiments, the thermal process may be carried out by approaching the byproduct to a showerhead, which may be operative to provide a process temperature between about −50° C. and about 1,000° C. In an embodiment, the process temperature is about 180° C. In other embodiments, the thermal process may be carried out by, for example, an oven, a furnace, a rapid thermal anneal (RTA) apparatus, or other thermal apparatus. The decomposition and/or sublimation of the byproduct may be described as the following formula:

(NF$_4$)$_2$SiF$_6$→SiF$_4$+NH$_3$+HF

Referring again to FIG. 1C, the pinch-off and the negative profile of the dielectric layer 125 may be substantially eliminated. In some embodiments forming the dielectric layer 125 having a thickness of about 1,000 Å, the etch process 130 may reduce the thickness b by about 14% and the thickness c by about 50%. In other embodiments forming the nitrogen dielectric layer 125 having a thickness of about 600 Å, the etch process 130 may reduce thickness b by about 11% and the thickness c by about 40%. Since the etch process 130 may remove the dielectric layer 125 around the corner 126 of the transistor 101 faster than the dielectric layer 125 adjacent to the bottom region 127 of the transistor 101, the aspect ratio of the gap between the etched dielectric layer 125a (shown in FIG. 1C) is less than that of the gap between the dielectric layer 125 (shown in FIG. 1B).

In some embodiments, the etch process 130 may remove the thickness a faster than the thickness b. The ratio of the etch rate of the thickness a to the etch rate of the thickness b may be about 2:1 or more. In other embodiments, the ratio is about 10:1 or more. In some embodiments, the etch process 130 may remove the thickness substantially equal to or faster than the thickness b. The ratio of the etch rate of the thickness to the etch rate of the thickness b may be about 1:1 or more. In other embodiments, the ratio is about 2:1 or more.

Figure 1D:
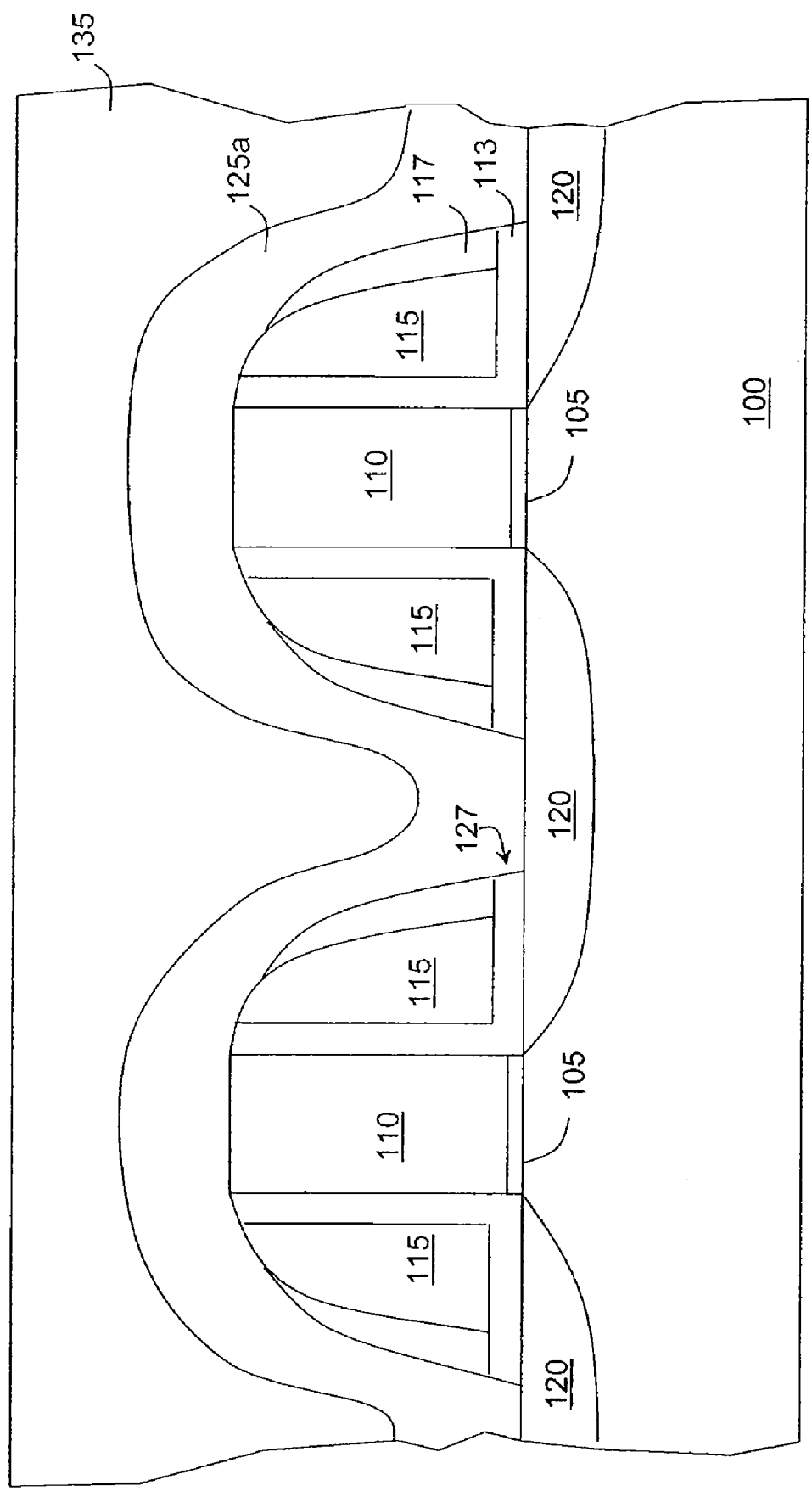

In FIG. 1D, a dielectric layer 135 is formed over the etched dielectric layer 125a. The dielectric layer 135 may be formed of, for example, oxide, nitride, oxynitride, low-k dielectric material, ultra low-k dielectric material, other dielectric material or various combinations thereof. The dielectric layer 135 may be formed by, for example, a CVD process, a spin-coating process, other method that is adapted to form a dielectric layer or various combinations thereof. Since the pinch-off and negative profile of the dielectric layer 125 (shown in FIG. 1B) is substantially removed, the dielectric layer 135 may be desirably filled within the gap between the etched dielectric layer 125a.

Referring again to FIG. 1D, the transistors 101 may be P-type metal-oxide-semiconductor field effect transistors (MOSFETs). The etched dielectric layer 125a such as a nitrogen-containing layer is a compressive layer which horizontally presses the transistor gate 110. The etched dielectric layer 125a may induce a compressive strain in the channel region of the transistor 101 within the substrate 200 under the transistor gate 110. The compressive strain may desirably enhance the hole mobility within the channel.

It is also found that the thickness b' may affect the hole mobility of the PMOSFET. The increase of the thickness b' may desirably enhance the hole mobility of the PMOSFET. Since the etch process 130 may not substantially etch the dielectric layer 125 adjacent to the bottom 127 of the transistor 101, the thickness b' of the remnant of the etched dielectric layer 125 may desirably improve the hole mobility of the PMOSFET. In some embodiments, the thickness b' of the etched dielectric layer 125a may be about 600 Å or more. Accordingly, the thickness b' may desirably enhance the hole mobility of the PMOSFET and reduce the aspect ratio between the transistors 101 as well.

Figure 1E:
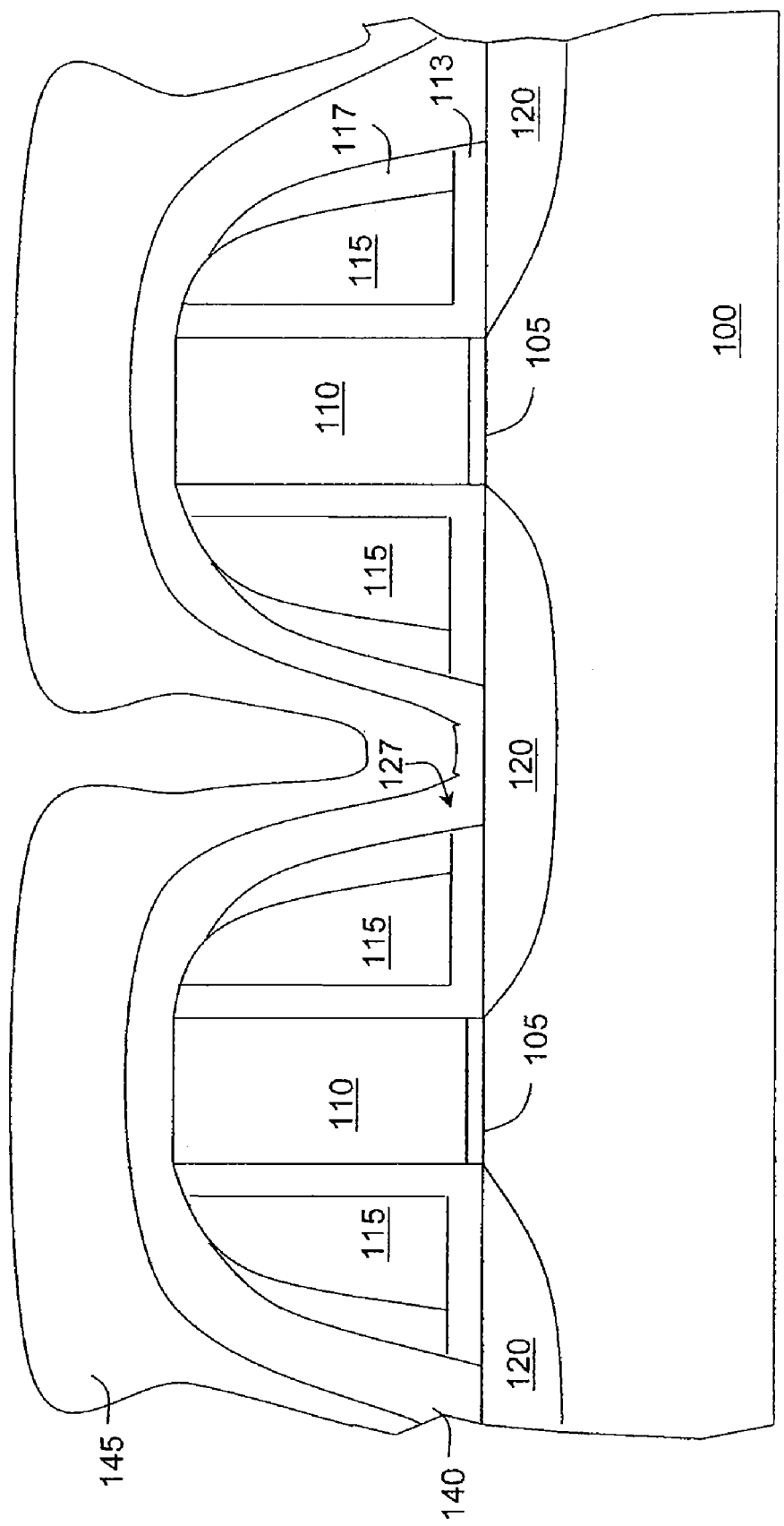
FIG. 1E is a schematic cross-sectional view of an exemplary dielectric structure formed over exemplary transistors.

FIG. 1E is a schematic cross-sectional view of an exemplary dielectric structure formed over exemplary transistors. In FIG. 1E, a dielectric layer 140 and a dielectric layer 145 may be sequentially formed over the transistors 101. In some embodiments, the dielectric layers 140 and 145 are different dielectric layers. In other embodiments, the dielectric layers 140 and 145 may be similar to the dielectric layer 125 described above in conjunction with FIG. 1B. In still other embodiments, the dielectric layers 140 and 145 are a SiC layer/a SiN layer, a SiCN layer/a SiN layer, a SiCN layer/a SiN layer, a BN layer/a SiN layer or various combinations thereof.

In some embodiments, the etch process 130 described above in conjunction with FIG. 1C may removes a first portion of the dielectric layer 145 over the top surfaces of the transistor gates 110 faster than a second portion of the dielectric layer 145 adjacent to the bottom regions 127 of the transistors 101. In other embodiment, the etch process 130 may also remove a portion of the dielectric layer 140 over the top surfaces of the transistor gates 110 without substantially removing the dielectric layer adjacent to the bottom regions 127 of the transistors 101.

It is noted that the number of the dielectric layers are not limited to the exemplary embodiments described above. More than two dielectric layers may be formed over the transistors 101 and then subjected to the etch process 130 in order to achieve a desired aspect ratio of the etched structure. It is also noted that the etch process 130 may include a single step or multiple steps for removing the portions of the dielectric layer 140 and/or the dielectric layer 145.

Figure 2B:
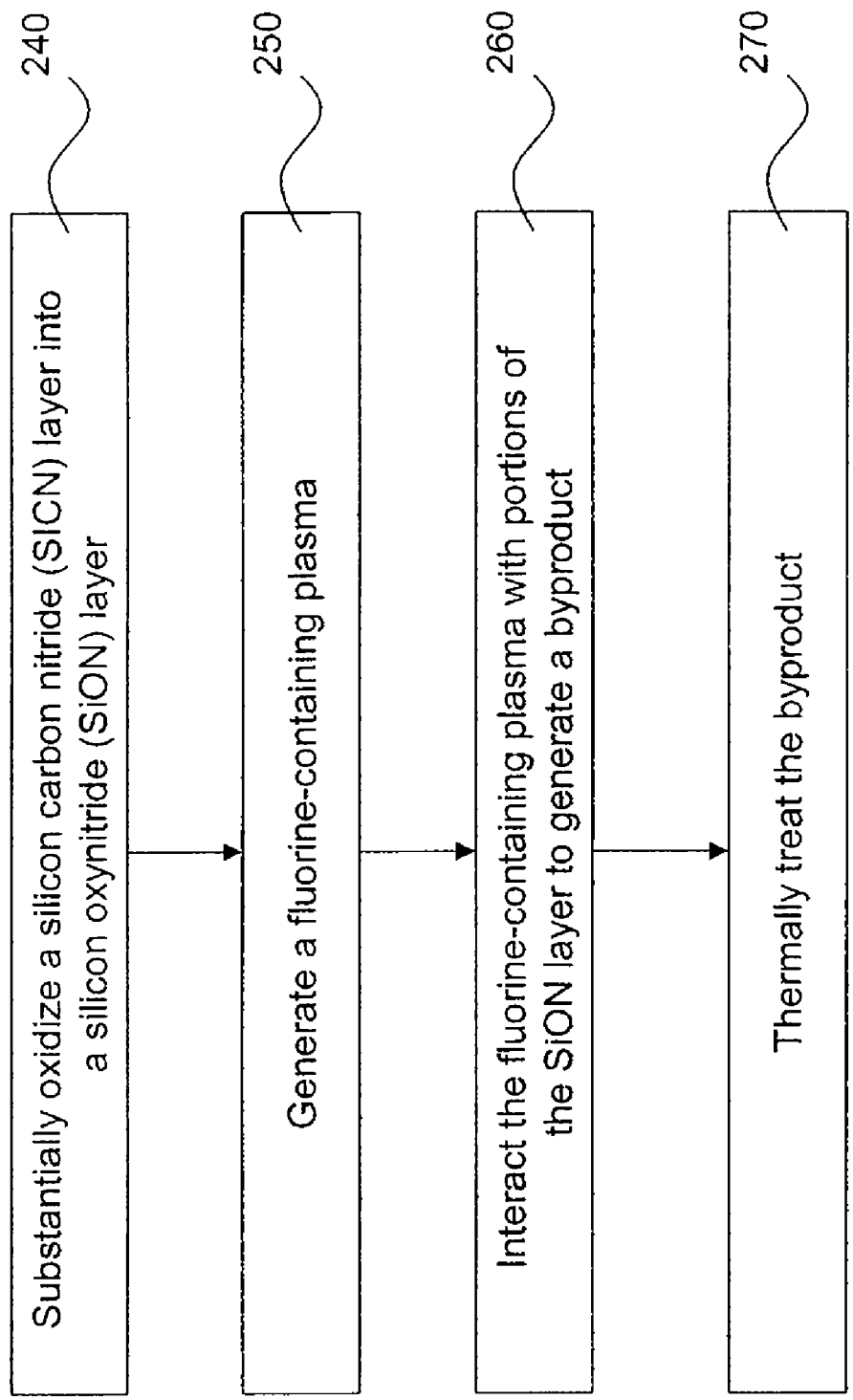
FIG. 2B is a flow chart showing another exemplary process for removing portions of a nitrogen-containing dielectric layer.

FIG. 2B is a flowchart showing an exemplary process for etching portions of a silicon carbon nitride (SiCN) layer. In some embodiments, the dielectric layer 125 is a silicon carbon nitride layer. It is found out that the $NF_3/H_2$/He precursor may not desirably remove SiCN due to the existence of carbon. In some embodiments, the SiCN layer may be oxidized in, for example, a deposition chamber as described in step 240 of FIG. 2B. The SiCN layer may be oxidized by, for example, oxygen, ozone, other oxygen-containing gas or various combinations thereof. After the oxidation, carbon of the SiCN may be desirably removed therefrom and the SiCN layer may be substantially oxidized into a silicon oxynitride (SiON) layer.

Referring again to FIG. 2B, step 250 may generate a fluorine-containing plasma. In some embodiments, step 250 may be similar to step 210 described above in conjunction with FIG. 2A. In other embodiments, step 250 may use a precursor of $NF_3/NH_3$ to generate the fluorine-containing plasma. In still other embodiments, step 250 may use $NF_3/H_2$/He precursor and $NF_3/NH_3$ precursor to generate the fluorine-containing plasma.

Referring again to FIG. 2B, step 260 interacts the fluorine-containing plasma and portions of the SiON layer to form a byproduct; and step 270 thermally treat the byproduct to decompose or sublimate the byproduct. In some embodiments, steps 260 and 270 are similar to steps 220 and 230, respectively, described above in conjunction with FIG. 2A.

After step 270, a dielectric layer may be formed over the etched dielectric layer. The dielectric layer and methods for forming the dielectric layer may be similar to those described above in conjunction with FIG. 1D.

Exemplary Film Deposition System

Deposition systems that may deposit a dielectric layer may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems such as PRODUCER™ Celera™ PECVD, available from Applied Materials, Inc. of Santa Clara, Calif.

Examples of substrate processing systems that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 3A:
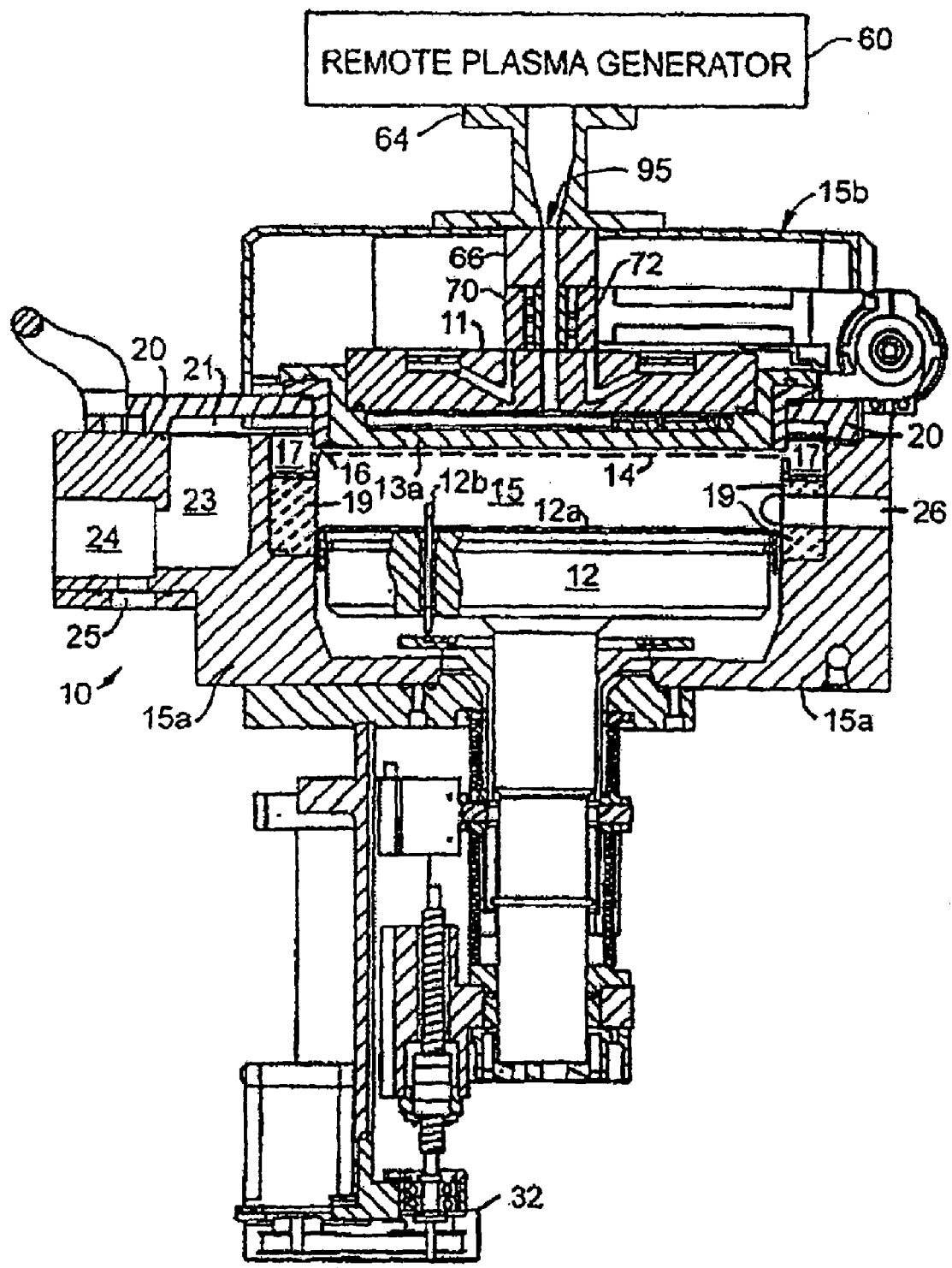
FIG. 3A shows a vertical cross-sectional view of an exemplary thin film deposition system.
Figure 3:
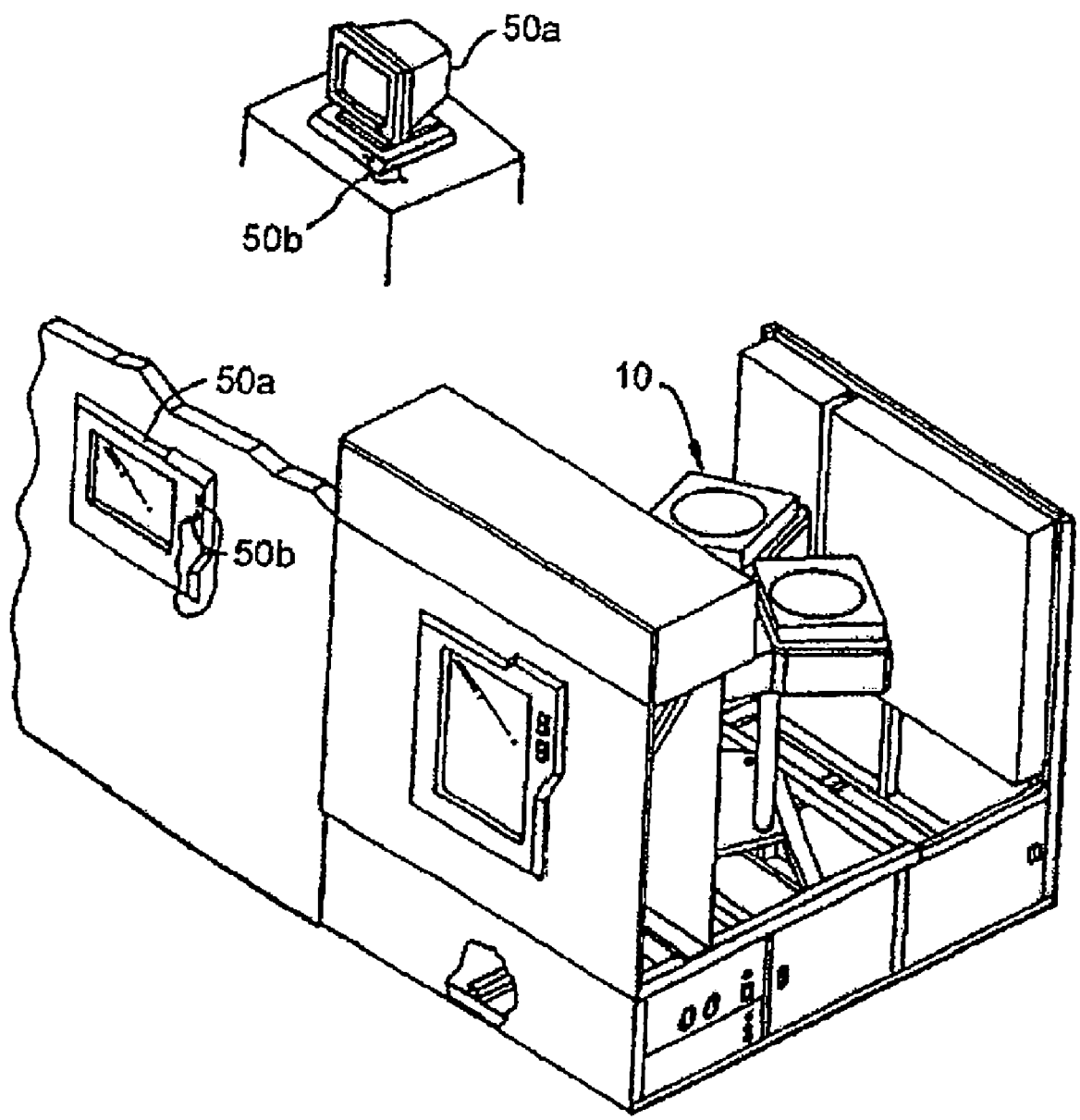
FIG. 3B is a simplified diagram of an exemplary system monitor/controller component of a thin film deposition system.

Referring now to FIG. 3A, vertical cross-sectional views of a CVD system 10 is shown that has a vacuum or processing chamber 15 that includes a chamber wall 15a and a chamber lid assembly 15b. The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 3A) and an upper processing position (indicated by dashed line 14 in FIG. 3A), which is closely adjacent to the manifold 11. A centerboard (not shown) includes sensors for providing information on the position of the wafers.

Deposition and carrier gases are introduced into the chamber 15 through perforated holes 13b of a conventional flat, circular gas distribution faceplate 13a. More specifically, deposition process gases flow into the chamber through the inlet manifold 11, through a conventional perforated blocker plate 42 and then through holes 13b in gas distribution faceplate 13a.

Before reaching the manifold 11, deposition and carrier gases are input from gas sources 7 through gas supply lines 8 into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process.

In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360.degree. circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor 32 (FIG. 3A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller over control lines 36, of which only some are shown. Controller 34 relies on feedback from optical sensors to determine the position of movable mechanical assemblies such as the throttle valve and susceptor which are moved by appropriate motors under the control of controller 34.

In the exemplary embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller 34 is via a CRT monitor 50a and light pen 50b, shown in FIG. 3B, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

FIG. 3A shows a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 3A. The adaptor 64 is typically made of metal. A mixing device 70 is coupled to the upstream side of the gas distribution manifold 11 (FIG. 3A). The mixing device 70 includes a mixing insert 72 disposed inside a slot 74 of a mixing block for mixing process gases. A ceramic isolator 66 is placed between the mounting adaptor 64 and the mixing device 70 (FIG. 6A). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. A three-way valve 77 controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Exemplary Etch System

Etch systems that may implement an etch process may include, for example, a SiConi™ Preclean chamber/system, available from Applied Materials, Inc. of Santa Clara, Calif.

Figure 4:
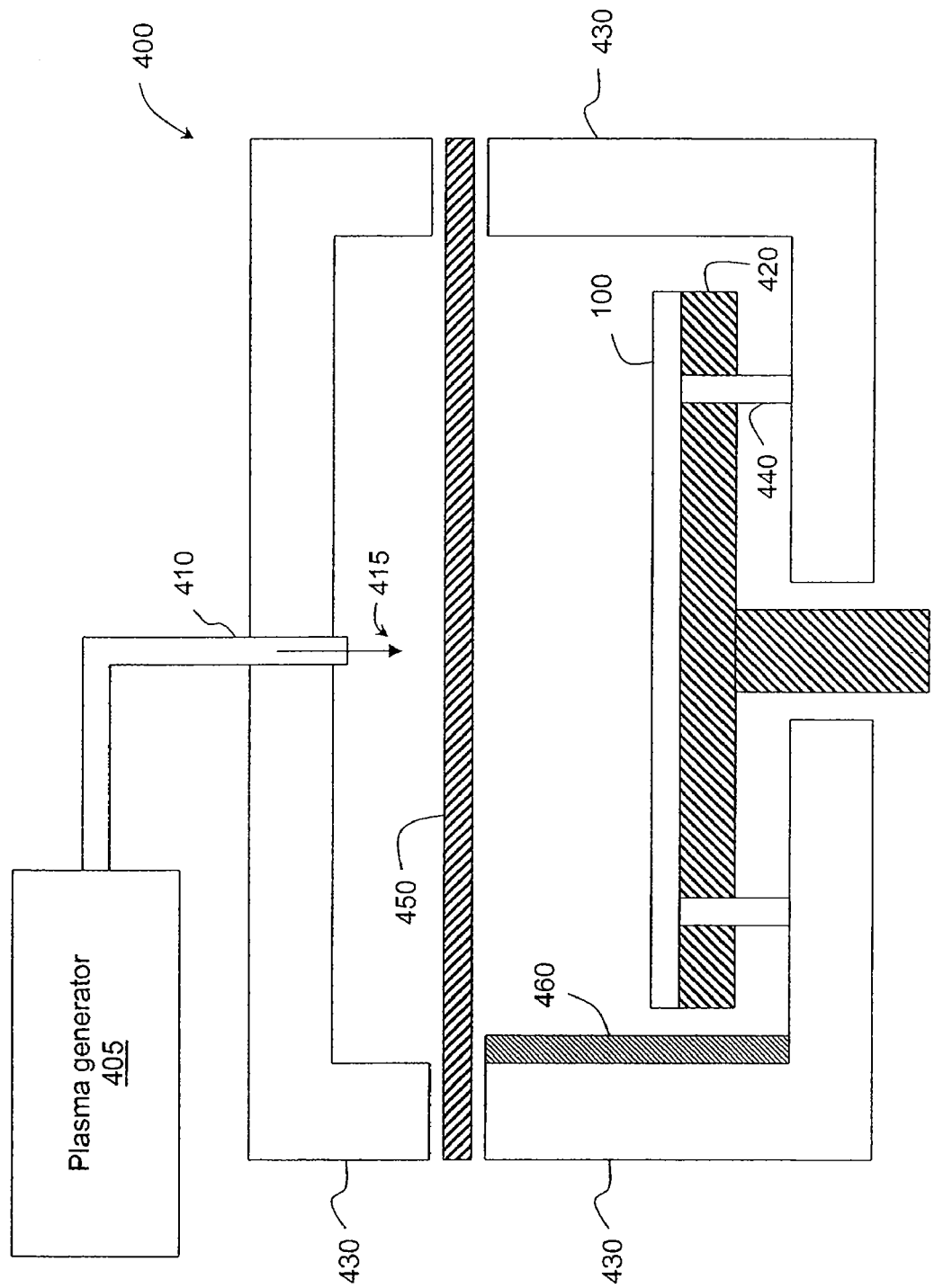
FIG. 4 is a schematic cross-sectional view of an exemplary etch system.

FIG. 4 is a schematic cross-sectional view of an exemplary etch chamber. The etch chamber 400 may include a chamber wall 430. The etch chamber 400 may include a plasma distribution apparatus 410 such as a tube, pipe and/or manifold for dispersing a process plasma 415 to the substrate 100 that rests on a pedestal 420 centered within the process chamber. The etch chamber 400 may be coupled to a plasma generator 405 through the plasma distribution apparatus 410. The plasma generator 405 is configured to generate the plasma 415. The substrate 100 may be moved controllably between a lower position/upper position near to a showerhead 450 by pins 440. The substrate 100 may have the features 101 and the dielectric layer 125 (shown in FIG. 1B) formed thereover.

In some embodiments, the plasma distribution apparatus 410 may introduce the plasmas 415 generated by, for example, step 210 or 250 described above in connection to FIG. 2A or 2B, respectively, into the processing chamber 400. In some embodiments, the supply line for the etch plasmas 415 may include (i) several safety shut-off valves (not shown) that can be used to automatically or manually shut-off the flow of process plasmas into the chamber, and (ii) mass flow controllers (not shown) that measure the flow of the plasmas 415 through the supply line.

Referring again to FIG. 4, the chamber wall 430 may have a temperature to substantially prevent condensations of etchants and/or byproducts thereon. In some embodiments, the pedestal 420 may be operative to provide a desired temperature between about −100° C. and about 1,000° C. to condense etchants on the surface of the substrate 100, i.e., the dielectric layer 125 over the substrate 100. The etchants then may desirably interact with the dielectric layer 125 formed over the substrate 100 so as to generate the byproduct described above in conjunction with FIG. 2A or 2B. After the generation of the byproduct, pins 440 may lift the substrate 100 approaching the showerhead 450. The showerhead 450 may be operative to provide a process temperature between about −50° C. and about 1,000° C. In some embodiments, the showerhead 450 may perform step 230 or 270 described above in conjunction with FIG. 2A or 2B, respectively, to decompose and/or sublimate the byproduct to remove the portions of the dielectric layer 125.

Referring again to FIG. 4, at least one pumping channel 460 may be configured within the etch chamber 400 to desirably remove the byproducts and/or the decomposed gases. The pumping channel 460 may be coupled to, for example, a pump or motor, such that the byproducts may be desirably removed. In some embodiments, the pumping channel 460 may have at least one aperture (not shown) through which the byproducts can be desirably removed.

In some embodiments, an RF power supply (not shown) may be coupled to the plasma generator 405 to excite a process gas including a fluorine-containing precursor and a hydrogen-containing precursor to form the plasma 415. The RF power supply may be operative to provide a RF power between about 5 watts and about 3,000 watts. The RF power supply may supply the power at a RF frequency between about 100 kHz and about 64 MHz.

A system controller (not shown) may controls all of the activities of the etch system. The system controller executes system control software, which is a computer program stored in a computer-readable medium such as a memory. In some embodiments, the memory is a hard disk drive, but the memory may also be other kinds of memory. The computer program includes sets of instructions that dictate the timing, mixture of gases, chamber pressure, chamber temperature and other parameters of a particular process. Other computer programs stored on other memory devices including, for example, a floppy disk or other another appropriate drive, may also be used to operate controller.

A process for etching portions of a film over a substrate can be implemented using a computer program product that is executed by the controller described above. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for forming a structure, comprising:
    forming at least one feature across a surface of a substrate;
    forming a silicon carbon nitride layer over the at least one feature;
    substantially oxidizing the silicon carbon nitride layer into a silicon oxynitride layer;
    removing a first portion of the silicon oxynitride layer on at least one sidewall of the at least one feature at a first rate and a second portion of the silicon oxynitride layer over the substrate adjacent to a bottom region of the at least one feature at a second rate, the first rate being greater than the second rate; and
    forming a dielectric layer over the silicon oxynitride layer.

2. The method of claim 1, wherein forming the at least one feature comprises forming at least one transistor gate.

3. The method of claim 2 further comprising:
    forming at least one contact region within the substrate and adjacent to the at least one transistor gate; and
    forming at least one dielectric spacer on at least one sidewall of the at least one transistor gate.

4. The method of claim 1, wherein removing the first portion and the second portion of the silicon oxynitride layer further comprises removing a third portion of the silicon oxynitride layer over the at least one feature at a third rate, and a ratio of the third rate to the second rate is about 2:1 or more.

5. The method of claim 1, wherein removing the portions of the silicon oxynitride layer comprises:
    generating a fluorine-containing plasma;
    interacting the fluorine-containing plasma with the first portion and the second portion of the silicon oxynitride layer to generate a byproduct; and
    thermally treating the byproduct to remove the portions of the silicon oxynitride layer.

6. The method of claim 5, wherein generating the fluorine-containing plasma uses a precursor selected from the group consisting of trifluoride ($NF_3$), silicon tetrafluoride ($SiF_4$), tetrafluoromethane ($CF_4$), fluoromethane ($CH_3F$), difluoromethane ($CH_2F_2$), trifluoromethane ($CHF_3$), octafluoropropane ($C_3F_8$) and hexafluoroethane ($C_2F_6$).

7. The method of claim 5, wherein interacting the fluorine-containing plasma with the portions of the silicon oxynitride layer comprises disposing the substrate on a pedestal having a temperature between about −100° C. and about 1,000° C.

8. The method of claim 5, wherein thermally treating the byproduct comprises sublimating the byproduct.

9. The method of claim 5, wherein thermally treating the byproduct has a process temperature between about −50° C. and about 1,000° C.

10. The method of claim 5 further comprising lifting the substrate approaching a showerhead.

11. A method for forming a transistor, comprising:
    forming at least one transistor gate over a substrate;
    forming at least one dielectric spacer on sidewalls of the at least one transistor gate;
    forming at least one contact region within the substrate and adjacent to the transistor gate;
    forming a silicon carbon nitride layer over the at least one transistor gate;
    substantially oxidizing the silicon carbon nitride layer into a silicon oxynitride layer;
    removing a first portion of the silicon oxynitride layer on at least one sidewall of the at least one transistor gate at a first rate and a second portion of the silicon oxynitride layer over the substrate adjacent to a bottom region of the at least one transistor gate at a second rate, the first rate being greater than the second rate; and
    forming a dielectric layer over the silicon oxynitride layer.

12. The method of claim 11, wherein removing the first portion and the second portion of the silicon oxynitride layer comprises:
    generating a fluorine-containing plasma;
    interacting the fluorine-containing plasma with the first portion and the second portion of the silicon oxynitride layer to generate a byproduct; and
    thermally treating the byproduct to remove the first portion and the second portion of the silicon oxynitride layer.

13. The method of claim 12, wherein generating the fluorine-containing plasma uses a precursor selected from the group consisting of trifluoride ($NF_3$), silicon tetrafluoride ($SiF_4$), tetrafluoromethane ($CF_4$), fluoromethane ($CH_3F$), difluoromethane ($CH_2F_2$), trifluoromethane ($CHF_3$), octafluoropropane ($C_3F_8$) and hexafluoroethane ($C_2F_6$).

14. The method of claim 12, wherein interacting the fluorine-containing plasma with the portions of the silicon oxynitride layer comprises disposing the substrate on a pedestal having a temperature between about −100° C. and about 1,000° C.

15. The method of claim 12, wherein thermally treating the byproduct comprises sublimating the byproduct.

16. The method of claim 12, wherein thermally treating the byproduct has a process temperature between about −50° C. and about 1,000° C.

17. The method of claim 12 further comprising lifting the substrate approaching a showerhead.

* * * * *

UNITED STATES PATENT AND TRADEMARK OFFICE
CERTIFICATE OF CORRECTION

PATENT NO. : 7,871,926 B2  
APPLICATION NO. : 11/876649  
DATED : January 18, 2011  
INVENTOR(S) : Li-Qun Xia et al.

It is certified that error appears in the above-identified patent and that said Letters Patent is hereby corrected as shown below:

Column 14, claim 11, line 25, delete "adiacent" insert --adjacent--

Column 14, claim 11, line 33, delete "adiacent" insert --adjacent--

Signed and Sealed this
Nineteenth Day of April, 2011

David J. Kappos
*Director of the United States Patent and Trademark Office*